(12) United States Patent
Mandlik et al.

(10) Patent No.: US 9,455,417 B2
(45) Date of Patent: Sep. 27, 2016

(54) SPLIT ELECTRODE FOR ORGANIC DEVICES

(71) Applicant: Universal Display Corporation, Ewing, NJ (US)

(72) Inventors: Prashant Mandlik, Lawrenceville, NJ (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/534,615

(22) Filed: Nov. 6, 2014

(65) Prior Publication Data

US 2015/0069370 A1    Mar. 12, 2015

Related U.S. Application Data

(63) Continuation of application No. 13/324,420, filed on Dec. 13, 2011, now abandoned.

(51) Int. Cl.
  *H01L 51/52*      (2006.01)
  *H01L 51/56*      (2006.01)

(52) U.S. Cl.
  CPC ....... *H01L 51/5234* (2013.01); *H01L 51/5253* (2013.01); *H01L 51/5259* (2013.01); *H01L 51/5275* (2013.01); *H01L 51/56* (2013.01)

(58) Field of Classification Search
  CPC .................................................. H01L 51/5215
  See application file for complete search history.

(56) References Cited

U.S. PATENT DOCUMENTS

| | | |
|---|---|---|
| 4,769,292 A | 9/1988 | Tang et al. |
| 5,047,687 A | 9/1991 | VanSlyke |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |

(Continued)

FOREIGN PATENT DOCUMENTS

| | | |
|---|---|---|
| CN | 101707237 | 5/2010 |
| EP | 0650955 | 5/1995 |

(Continued)

OTHER PUBLICATIONS

Lewis, J. et al. Highly flexible transparent electrodes for organic light-emitting diode-based displays. Appl. Phys. Lett. 85 (2004) 3450-3452.*

(Continued)

*Primary Examiner* — Thao X Le
*Assistant Examiner* — Gardner W Swan
(74) *Attorney, Agent, or Firm* — Duane Morris LLP

(57) ABSTRACT

A device includes a first electrode, an organic layer disposed over the first electrode and a second electrode disposed over the organic layer. The second electrode includes a first conductive layer, a first separation layer disposed over the first conductive layer, and a second conductive layer disposed over the first separation layer, wherein the first separation layer is not a continuous layer and the first and second conductive layers are bridged where the first separation layer is not continuous. The first separation layer has an extinction coefficient that is at least 10% different from the extinction coefficient of the first conductive layer at wavelength 500 nm, or an index of refraction that is at least 10% different from the index of refraction of the first conductive layer at wavelength 500 nm.

28 Claims, 13 Drawing Sheets

(56) References Cited

U.S. PATENT DOCUMENTS

| | | | |
|---|---|---|---|
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,012,368 | B2 | 3/2006 | Kim |
| 7,071,615 | B2 | 7/2006 | Lu et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,247,984 | B2 | 7/2007 | Tanase et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson. |
| 7,393,599 | B2 | 7/2008 | Thompson et al. |
| 7,396,598 | B2 | 7/2008 | Takeuchi et al. |
| 7,420,215 | B2 | 9/2008 | Inoue et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 8,253,328 | B2 | 8/2012 | Hayashi |
| 2001/0038429 | A1* | 11/2001 | Baek ............... G02F 1/133553 349/113 |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2002/0180902 | A1 | 12/2002 | Izumi et al. |
| 2003/0138657 | A1 | 7/2003 | Li et al. |
| 2003/0151042 | A1 | 8/2003 | Hueschen |
| 2003/0152802 | A1 | 8/2003 | Tsuboyama et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0119406 | A1 | 6/2004 | Kobayashi |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0058852 | A1* | 3/2005 | Tyan ............... H01L 51/5036 428/690 |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2005/0263761 | A1* | 12/2005 | Kim ............... H01L 27/12 257/57 |
| 2006/0008670 | A1 | 1/2006 | Lin et al. |
| 2006/0018199 | A1 | 1/2006 | Louie |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2007/0285003 | A1* | 12/2007 | Smith ............... H01L 51/5234 313/504 |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0210303 | A1 | 9/2008 | Lu et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2011/0132449 | A1* | 6/2011 | Ramadas ............ H01L 51/5237 136/256 |
| 2012/0181526 | A1 | 7/2012 | Kasahara et al. |

FOREIGN PATENT DOCUMENTS

| | | |
|---|---|---|
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| TW | 201023671 | 6/2010 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Rakić, A. D. et al. Optical properties of metallic films for vertical-cavity optoelectronic devices, Appl. Opt. 37 (1998) 5271-5283.*

Mohamed, S. H. et al. Properties of indium tin oxide thin films deposited on polymer substrates. Acta Phys. Pol. A 115 (2009) 704-708.*

König, T. A. F. et al. Electrically tunable plasmonic behavior of nanocube-polymer nanomaterials induced by a redox-active electrochromic polymer, ACS Nano 8 (2014) 6182-6192.*

Refractive index database. http://refractiveindex.info/?shelf=other&book=In2O3-SnO2&page=Konig, accessed Nov. 24, 2015.*

(56) References Cited

OTHER PUBLICATIONS

Refractive index database. http://refractiveindex.info/?shelf=main&book=Ag&page=Rakic, accessed Nov. 24, 2015.*

Refractive index database. http://refractiveindex.info/?shelf=main&book=Al&page=Rakic, accessed Nov. 24, 2015.*

Guo, S. et al. Determination of refractive index and thickness of thick transparent films by variable-angle spectroscopic ellipsometry: application to benzocyclobutene films. Appl. Optics 35 (1996) 1693-1699.*

Folks, W. R. et al. Spectroscopic ellipsometry of materials for infrared micro-device fabrication. Phys. Stat. Sol. C 5 (2008) 1113-1116.*

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett, vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater, 19:739-743 (2007).

Huang, Wei-Sheng et al., "Highly Phosphorescent Bis-Cyclometalated Iridium Complexes Containing Benzoimidazole-Based Ligands," Chem. Mater, 16(12):2480-2488 (2004).

Hung, L.S. et al., "Anode Modification in Organic Light-Emitting Diodes by Low-Frequency Plasma Polymerization of CHF3," Appl. Phys. Lett, 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett, 77(15)2280-2282 (2000).

Lo, Shih-Chun et al., "Blue Phosphorescence from Iridium(III) Complexes at Room Temperature," Chem. Mater., 18 (21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91209-215 (1997).

Shirota, Yasuhiko et al., "Starburst Molecules Based on p-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergard et al., "Langmuir-Blodgett Light-Emitting Diodes of Poly(3-Hexylthiophene) Electro-Optical Characteristics Related to Structure," Synthetic Metals, 87:171-177 (1997).

Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).

(56) References Cited

OTHER PUBLICATIONS

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater., 17(8)1059-1064 (2005).

Van Slyke, S. A. et al., "Organic Electroluminescent Devices with Improved Stability," Appl. Phys. Lett, 69(15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

Meservey R and Tedrow PM, "Properties of very thin aluminum films", J. of App. Phys., 41, 1, 51-53 (1971).

Liu, ZT et al., "The characterization of the optical functions of BCP and CBP thin films by spectroscopic ellipsometry", Synthetic Materials, 150, 2 (2005) p. 159-163.

Duan et al., "Improved flexibility of flexible organic light-emitting devices by using a metal/organic multilayer Cathose", J. Phys. D: Appl. Phys. 42 (2009).

Office Action issued on Mar. 4, 2016 in corresponding Chinese Patent Application No. 201210539160.4.

Search Report issued on May 12, 2016 for corresponding ROC (Taiwan) Patent Application No. 101145859.

\* cited by examiner

SPLIT ELECTRODE FOR ORGANIC DEVICES

CROSS-REFERENCE TO RELATED APPLICATIONS

This application is a continuation application of co-pending U.S. application Ser. No. 13/324,420, filed Dec. 13, 2011, the disclosure of which is incorporated herein by reference in its entirety.

THE PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to a split electrode.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted $Ir(ppy)_3$, which has the following structure:

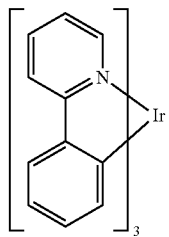

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A device is provided. The device includes a first electrode, an organic layer disposed over the first electrode and a second electrode disposed over the organic layer. The second electrode further includes a first conductive layer having an extinction coefficient and an index of refraction, a first separation layer disposed over the first conductive layer, and a second conductive layer disposed over the first separation layer. The first separation layer has an extinction coefficient that is at least 10% different from the extinction coefficient of the first conductive layer at 500 nm, or an index of refraction that is at least 10% different from the index of refraction of the first conductive layer at 500 nm. Preferably, the first separation layer has an extinction coefficient that is at least 10% different from the extinction coefficient of the first conductive layer at 500 nm. More preferably, the first separation layer also has an index of refraction that is at least 10% different from the index of refraction of the first conductive layer at 500 nm. The device also includes a barrier layer disposed over the second conductive layer.

Preferably, the first separation layer has an extinction coefficient at 500 nm less than 5, more preferably less than 3, and most preferably less than 1.

In one embodiment, the first separation layer consists essentially of an organic material. When the first separation layer is an organic material, the first separation layer preferably has a thickness of at least 20 nm.

In one embodiment, the first separation layer consists essentially of an inorganic material.

Preferably, the first conductive layer has a thickness not more than 150 nm.

Preferably, the first conductive layer has a water vapor transmission rate at least 5% different from that of the first separation layer, and the second conductive layer has a water vapor transmission rate at least 5% different from that of the first separation layer. More preferably, the first conductive layer has a water vapor transmission rate at least 10% different from that of the first separation layer, and the second conductive layer has a water vapor transmission rate at least 10% different from that of the first separation layer. Most preferably, the first conductive layer has a water vapor transmission rate at least 25% different from that of the first separation layer, and the second conductive layer has a water vapor transmission rate at least 25% different from that of the first separation layer.

In one embodiment, the first conductive layer is a low work function metallic layer or an inorganic layer. Preferred low work function metallic layer materials for the first conductive layer include Ca and MgAg.

In one embodiment, the second conductive layer is a low work function metallic layer or an inorganic layer. Preferred low work function metallic layer materials for the second conductive layer include Ca and MgAg.

In one embodiment, the first conductive layer and the second conductive layer have the same material composition.

In one embodiment, the first conductive layer and the second conductive layers have different material compositions.

In one embodiment, the first separation layer is a metallic layer, an inorganic layer, or an organic layer.

The device may further comprise a substrate, and the first electrode may be disposed over the substrate.

In one embodiment, the substrate is a rigid substrate having a flexural rigidity greater than $2 \times 10^{-2}$ Nm. Preferred materials for a rigid substrate include glass, ceramic, and metal having a thickness sufficient to result in the desired flexural rigidity.

In one embodiment, the substrate is a flexible substrate having a flexural rigidity less than $2 \times 10^{-2}$ Nm. Preferred materials for a flexible substrate include metal, plastic, paper, fabric and a composite material. The materials have a thickness sufficiently low to result in the desired flexural rigidity. Composites can be ceramic matrix composites, metal matrix composites, or polymer matrix composites.

In one embodiment, the first electrode is an anode, and the device further includes a permeation barrier layer disposed between the anode and the substrate. The device also further includes a water reacting layer disposed between the substrate and the anode. This embodiment is particularly preferred for use with flexible substrates, which tend to be more susceptible to moisture penetrating the substrate.

In one embodiment, the device further includes a lamination layer disposed over the barrier layer. A lamination layer can be a thin polymer membrane attached to the substrate using an adhesive, a thin spun-on polymer layer, an evaporated polymer layer, a spray coated, or an aerosol dispersed polymer layer.

In one embodiment, the second electrode further includes a second separation layer disposed over the second conductive layer, and a third conductive layer disposed over the second separation layer. Parameters described above with respect to the second conductive layer and the first separation layer are preferred for use with the third conductive layer and the second separation layer as well.

In one embodiment, the first separation layer consists essentially of a single material.

In one embodiment, the first separation layer comprises a mixture of at least two different materials.

In one embodiment, the first separation layer comprises a plurality of sublayers, wherein at least two of the sublayers have a different material composition.

Preferably, the barrier layer is transparent.

A method is also provided. The following layers are deposited, in order, over a substrate: a first electrode; an organic layer; a second electrode; and a barrier layer. Depositing the second electrode further comprises depositing, in order: a first conductive layer having an extinction coefficient and an index of refraction; a first separation layer disposed over the first conductive layer, and a second conductive layer disposed over the first separation layer. The first separation layer has an extinction coefficient that is at least 10% different from the extinction coefficient of the first conductive layer at 500 nm. Preferably, the first separation layer also has an index of refraction that is at least 10% different from the index of refraction of the first conductive layer at 500 nm.

Embodiments and preferences described above with respect to devices also apply to the method.

Embodiments of the invention may be used with a variety of organic devices. While many embodiments are described herein with respect to organic light emitting devices, other types of devices, such as organic photovoltaic devices and organic transistors, may benefit from the electrode and moisture protective structures described herein.

BRIEF DESCRIPTION OF THE DRAWINGS

FIGS. 7 and 7A show cross-sectional views of a device with multiple layer cathode with bridges between the two cathode layers via breaks in the sandwich layer, in which FIG. 7A shows a close-up of the region A identified by the dotted outline in FIG. 7.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
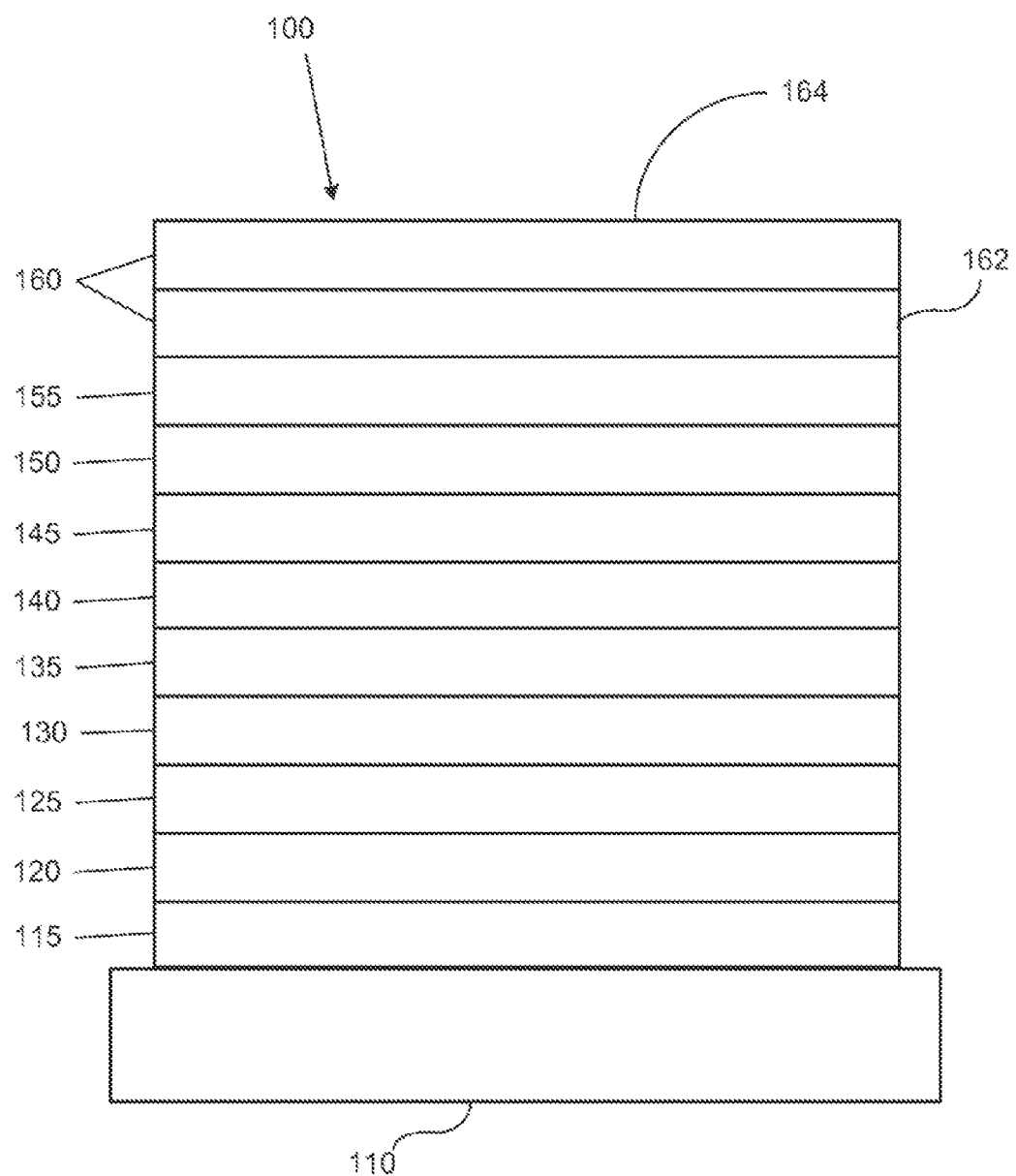
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
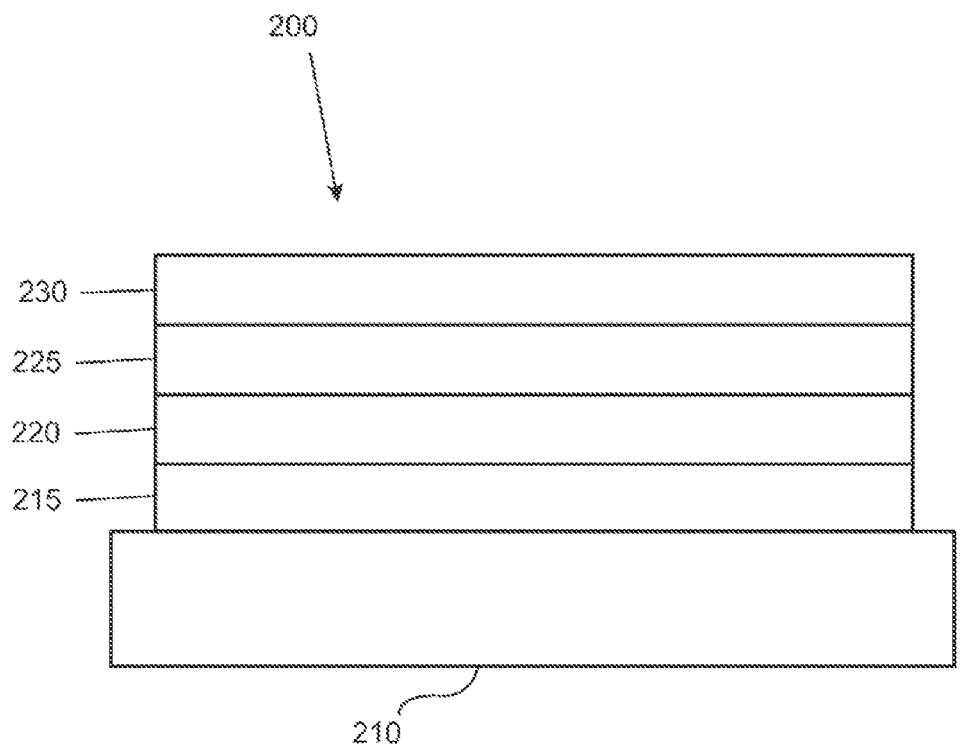
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

A structure and method to prolong the shelf life of OLEDs encapsulated with thin film encapsulation has been discovered. An electrode having a separation layer disposed between two conductive layers is used to direct the formation of defects caused by insulating film formation or interface delamination to locations in the device that are away from cathode-organic interface, such that dark spots are not formed.

A cathode layer (CL) may be divided into two or more conductive layers sandwiching a separation layer between them. Because of this division the water vapor penetrating through the encapsulation layer attacks the top most conductive or the separation layer of the CL. This often results in a reaction that forms an insulating (oxide-like) layer and/or causes delamination. Because the water reacts before reaching the bottommost conductive layer of the CL, that layer remains unaffected by the formation of this defect. As a result, the bottommost conductive layer of the CL continues functioning as a cathode. In addition, the bottommost conductive layer of the CL undergoing much less degradation when compared to a single layer cathode, thereby extending the shelf life of the device.

Another function for the top layer of such a divided cathode is acting as a desiccant to absorb moisture. The function of desiccant can be utilized on the anode side of the device in addition to the cathode side when the substrate is permeable, which is seen most often in the context of a plastic substrate or a flexible substrate. Plastic substrates are preferably used with a barrier film between the substrate and the device to prevent the device from degrading via the water vapor permeating through the substrate. If there is a thin layer of moisture absorbing material between the cathode and the encapsulation layer, it can react with the water molecules, delaying them from reaching the cathode-organic interface and forming dark spots.

There have been attempts to describe the utility of multilayer cathode. E.g., the experiment in the article, "Improved flexibility of flexible organic light-emitting devices by using a metal/organic multilayer Cathode, by Lian Duan, Song Liu, Deqing Zhang, Juan Qiao, Guifang Dong, LiduoWang and Yong Qiu, J. Phys. D: Appl. Phys. 42 (2009) 075103" describes improvements in device flexibility and lifetime (operational lifetime, not shelf lifetime) by using a multilayer (Al/Alq/Al) cathode topped with encapsulation consisting of four stacks of Alq/LiF, followed by CaO desiccant, followed by Al foil.

In contrast to the device disclosed in Duan, the multilayer cathode described herein is suitable for use in a device that emits light through the cathode, and that can be used, for example, in conjunction with a barrier layer that is a transparent thin film encapsulation layer disposed over the cathode.

There have been other attempts to use multilayer cathodes. E.g. US2006/018199A1 demonstrates a metal/inorganic/metal multilayer cathode in an OLED device.

Figure 3:
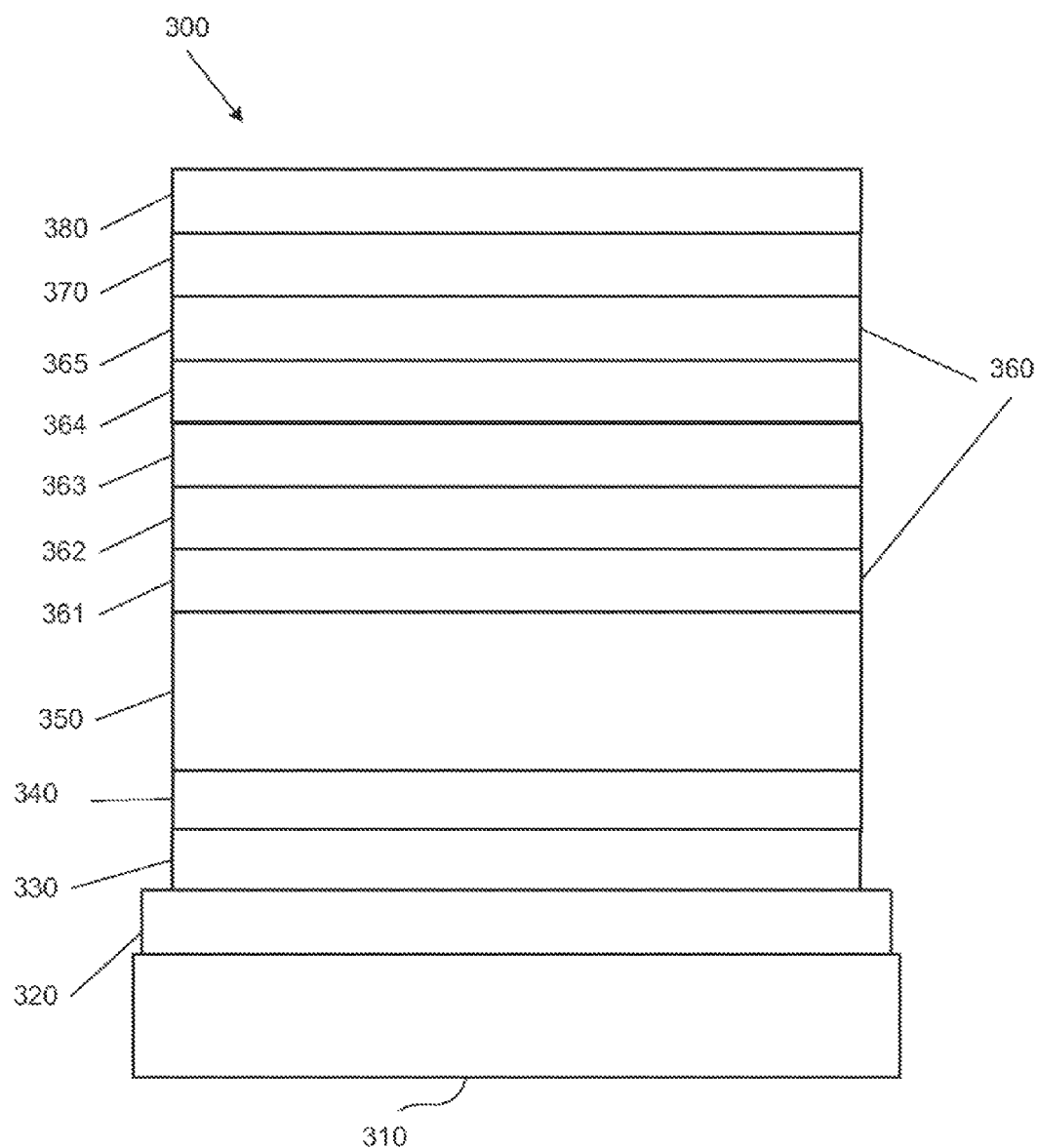
FIG. 3 shows an organic light emitting device that includes a split electrode.

FIG. 3 shows an organic device 300 having a split electrode. The device is disposed over a substrate 310. The device includes, in order, a permeation barrier 320, a water reacting layer 330, a first electrode 340, an organic layer 350, a second electrode 360, a barrier layer 370, and a lamination layer 380, Second electrode 360 is a split electrode that further includes a first conductive layer 361, a first separation layer 362, a second conductive layer 363, a second separation layer 364, and a third conductive layer 365. Many features shown in FIG. 3 are optional.

A device is provided. The device includes a first electrode, an organic layer disposed over the first electrode and a second electrode disposed over the organic layer. The second electrode further includes a first conductive layer having an extinction coefficient and an index of refraction, a first separation layer disposed over the first conductive layer, and a second conductive layer disposed over the first separation layer. The first separation layer has an extinction coefficient that is at least 10% different from the extinction coefficient of the first conductive layer at 500 nm, or an index of refraction that is at least 10% different from the index of refraction of the first conductive layer at 500 nm. Preferably, the first separation layer has an extinction coefficient that is at least 10% different from the extinction coefficient of the first conductive layer at 500 nm. More preferably, the first separation layer also has an index of refraction that is at least 10% different from the index of refraction of the first conductive layer at 500 nm. The device also includes a barrier layer disposed over the second conductive layer.

The organic layer may include multiple sublayers. For example, in an OLED, the organic layer may include all or some of the organic layers described with respect to FIGS. 1 and 2. In other types of organic devices, the organic layer may include multiple layers as well.

By "at least 10% different," it is meant, for example, that the first separation layer has an extinction coefficient that is either 10% greater or 10% less than that of the first conductive layer.

When light passes through a material, the measured intensity I of light transmitted through is related to the incident intensity I0 according to the inverse exponential power law called as Beer-Lambert Law. The expression is given by:

$$I = I_0 e^{-\delta x},$$

where x denotes the path length and $I = I_0 e^{-\delta x}$ is the absorption or attenuation coefficient. The absorption coefficient is one way to describe the absorption of electromagnetic waves in a medium. It can be expressed in terms of the imaginary part of the refractive index, κ, and the wavelength of the light in free space, $\lambda_0$, as $I = I_0 e^{-\delta x} = 4\pi\kappa/\lambda_0$. The imaginary part of the refractive index is also commonly called the extinction coefficient. The extinction coefficient, just like the real part of the refractive index, has no units. The real part of the refractive index (commonly called as the refractive index) of a medium denotes the ratio of the speed of the wave in a reference medium (such as vacuum) to that in the given medium.

Figure 11:
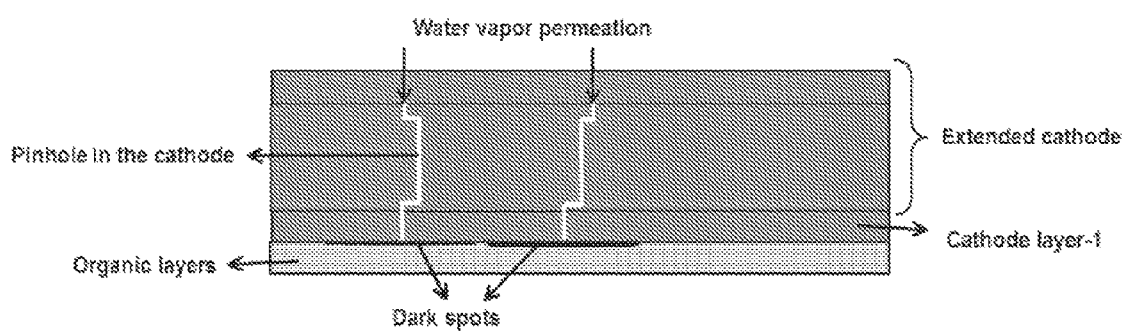
FIG. 11 shows a schematic cross-sectional view of organic layer of the OLED device and CL-1 and an extended cathode. The pinholes and other defects in the cathode continue to grow. The end result is not much different than if only the first CL were present. The defects form at the CL-1—organic interface and are visible as dark spots.

A difference in the extinction coefficient and refractive index between the separation layer and other layers is desirable because such a difference means that there is also a difference in material growth, chemistry, composition, density, and atomic arrangement and/or other physical properties such as the water vapor transmission rate. It is desirable to have a separation layer whose material properties are different from that of the conduction layer to perform its function as a separation layer. A material with different physical properties will allow the water vapor permeating through the permeation barrier get distributed instead of continuing down to the device in the absence of such layer as shown in FIG. 11. Extinction coefficient and refractive index, while correlating to water vapor transmission coefficient, are more readily obtainable from published references and can be measured more easily than water vapor transmission coefficient and hence can be used to pick materials suitable as the separation layer. Extinction coefficient or refractive index higher or lower than the conduction layer would imply difference in the physical properties and hence would ensure its proper functioning as the separation layer. As an example, the extinction coefficient and the refractive index of a commonly used conduction layer Al at 500 nm are 6.04 and 0.82. An inorganic film such as SiON would work well as the separation layer because of the difference in physical properties between the two materials. It has an extinction coefficient of 0 and a refractive index of 1.49 at 500 nm. From the previous example we see that both extinction coefficient and refractive index can be used to select a separation layer suitable for a conduction layer. The measurement of these two parameters is very simple and requires only a few minutes using an ellipsometer.

Barrier layers can be inorganic, such as SiNx, SiOx, and SiOxNy, or other oxides such as $TiO_2$, $HfO_2$ or nitrides such as TiN or AlTiN, or organometallic, such as SiOxCy, SiOxCyHz, SiCxOyNz or hybrid (mixtures of) inorganic-organic films, or multiple layers of alternate inorganic-organic films grown using evaporation techniques such as chemical vapor deposition (hot-wire or plasma assisted), or e-beam or thermal evaporation, or sputtering or atomic or molecular layer deposition. Organic films are compounds containing carbon such as Alq, NPD, polyacrylates, polycarbonates, etc. The barrier films can be deposited using aforementioned vacuum techniques or non-vacuum techniques such as printing or spin-on and sintering. Barrier layers are known, and any suitable barrier layer may be used.

Preferably, the first separation layer has an extinction coefficient less than 5 at 500 nm. More preferably, the first separation layer has an extinction coefficient less than 3 and even more preferably less than 1 at 500 nm Extinction coefficient and index of refraction are generally functions of wavelength. 500 nm is selected as a point at which to definitively quantify the effects of extinction coefficient and index of refraction because higher energy visible light, such as that around 500 nm, may generally cause more issues of various types in various devices than lower energy light.

In one embodiment, the first separation layer consists essentially of an organic material. When the first separation layer is an organic material, the first separation layer preferably has a thickness of at least 20 nm.

In one embodiment, the first separation layer consists essentially of an inorganic material.

Preferably, the first conductive layer has a thickness not more than 150 nm.

Preferably, the first conductive layer has a water vapor transmission rate at least 5% different from that of the first separation layer, and the second conductive layer has a water vapor transmission rate at least 5% different from that of the first separation layer. More preferably, the first conductive layer has a water vapor transmission rate at least 10% different from that of the first separation layer, and the second conductive layer has a water vapor transmission rate at least 10% different from that of the first separation layer. Most preferably, the first conductive layer has a water vapor transmission rate at least 25% different from that of the first separation layer, and the second conductive layer has a water vapor transmission rate at least 25% different from that of the first separation layer.

By "at least 5% different," it is meant, for example, that the first separation layer has a water vapor transmission rate (WVTR) that is either 5% greater or 5% less than that of the first conductive layer. A significant difference in the WVTR of these layers means that water traveling through the electrode somewhere hits a layer with a relatively high WVTR, where it can travel in a direction parallel to the electrode relatively easily and react to form an oxide over a wide area prior to reaching an interface where such a reaction causes a dark spot.

In one embodiment, the first conductive layer is a low work function metallic layer or an inorganic layer. Preferred low work function metallic layer materials for the first conductive layer include Ca and MgAg (Mg doped with Ag).

In one embodiment, the second conductive layer is a low work function metallic layer or an inorganic layer. Preferred low work function metallic layer materials for the second conductive layer include Ca and MgAg.

In one embodiment, the first conductive layer and the second conductive layer have the same material composition.

In one embodiment, the first conductive layer and the second conductive layers have different material compositions.

In one embodiment, the first separation layer is a metallic layer, an inorganic layer, or an organic layer.

The device may further comprise a substrate, and the first electrode may be disposed over the substrate.

In one embodiment, the substrate is a rigid substrate having a flexural rigidity greater than $2 \times 10^{-2}$ Nm. Preferred materials for a rigid substrate include glass, ceramic, and metal having a thickness sufficient to result in the desired flexural rigidity.

In one embodiment, the substrate is a flexible substrate having a flexural rigidity less than $2 \times 10^{-2}$ Nm. Preferred materials for a flexible substrate include metal, plastic, paper, fabric and a composite material. The materials have a thickness sufficiently low to result in the desired flexural rigidity. Composites can be ceramic matrix composites, metal matrix composites, or polymer matrix composites.

In one embodiment, the first electrode is an anode, and the device further includes a permeation barrier layer disposed between the anode and the substrate. The device also further includes a water reacting layer disposed between the substrate and the anode. This embodiment is particularly preferred for use with flexible substrates, which tend to be more susceptible to moisture penetrating the substrate.

The permeation barrier can be anywhere from 100 nm thick film in a low defect, low particulate scenario to a 50 µm thick film such as a combination of some thin inorganic film (like SiOxCyNz) with spun-on or evaporated or printed polymer film (like polyacrylate or polyepoxide). Preferably, the overall barrier layer is less than 25 µm thick and most preferably less than 10 µm thick. Reducing the thickness would improve the mechanical flexibility of the barrier film. The water reacting layer can be as thin as 5 nm when it is a thin metal film or as thick as 25 µm when it is a polymer film. The water reactive film, when it is polymer, can also act as a planarization layer used to minimize the surface roughness of the substrate.

In one embodiment, the device further includes a lamination layer disposed over the barrier layer. Its purpose is to prevent the barrier layer from mechanical degradation upon handling and transport. A lamination layer can be a thin polymer membrane attached to the substrate using an adhesive, a thin spun-on polymer layer, an evaporated polymer layer, a spray coated, or an aerosol dispersed polymer layer.

The lamination layer can be a layer of an organic or organometallic compound such as polyacrylates, polyepoxides, polysiloxanes, and other suitable materials. These can be UV or heat curable compounds, which will polymerize, or cross-link or set upon treating with UV light or heating or applying pressure, or simply leaving at room temperature for some interval of time. The lamination can also be such polymer adhesive layers followed by a polymer membrane or sheet such as PEN (polyethylene nepthlate), or polycarbonate, or polyimide or other suitable materials.

In one embodiment, the second electrode further includes a second separation layer disposed over the second conductive layer, and a third conductive layer disposed over the second separation layer. Parameters described above with respect to the second conductive layer and the first separation layer are preferred for use with the third conductive layer and the second separation layer as well.

An additional separation layer increases the number of interfaces and layers in which water can travel laterally and react prior to reaching an interface with the organic material, where the presence of water would cause a dark spot.

In one embodiment, the first separation layer consists essentially of a single material.

In one embodiment, the first separation layer comprises a mixture of at least two different materials.

In one embodiment, the first separation layer comprises a plurality of sublayers, wherein at least two of the sublayers have a different material composition.

Preferably, the barrier layer is transparent. As used herein, "transparent" means that the layer transmits more than 90% of incident light having a wavelength of 500 nm.

A method is also provided. The following layers are deposited, in order, over a substrate: a first electrode; an organic layer; a second electrode; and a barrier layer. Depositing the second electrode further comprises depositing, in order: a first conductive layer having an extinction coefficient and an index of refraction; a first separation layer disposed over the first conductive layer, and a second conductive layer disposed over the first separation layer. The first separation layer has an extinction coefficient that is at least 10% different from the extinction coefficient of the first conductive layer at 500 nm. Preferably, the first separation layer also has an index of refraction that is at least 10% different from the index of refraction of the first conductive layer at 500 nm.

Embodiments and preferences described above with respect to devices also apply to the method.

Embodiments of the invention may be used with a variety of organic devices. While many embodiments are described herein with respect to organic light emitting devices, other types of devices, such as organic photovoltaic devices and organic transistors, may benefit from the electrode and moisture protective structures described herein.

Figure 4:
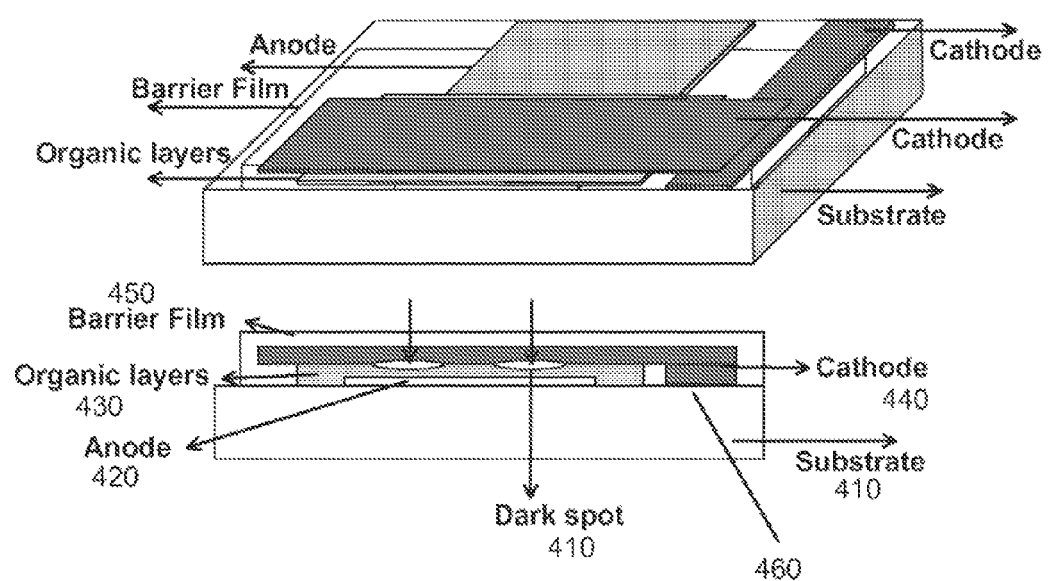
FIG. 4 shows schematic 3-D and cross-sectional views of a device with single layer cathode. Formation of dark spots at cathode-organic interface is also shown.

FIG. 4 shows schematic 3-D and cross-sectional views of a device with single layer cathode. Formation of dark spots at cathode-organic interface is also shown. The device of FIG. 4 includes a substrate 410, an anode 420, organic layers 430, a cathode 440 and a barrier film 450. A bus line 460 provides current to the cathode. Dark spot 470 is also shown.

Embodiment 1

In one embodiment, a moisture sensitive electrode of an electronic device is divided in to two or more layers with another metallic, inorganic or organic layer sandwiched in between to mitigate degradation. By way of comparative example, FIG. 4 shows the 3-D and the cross-sectional views (both schematic) of a device with single layer cathode. The dark spots form when water vapor penetrates through the encapsulation film to reach the cathode-organic interface, causing affected regions to stop emitting.

Figure 5:
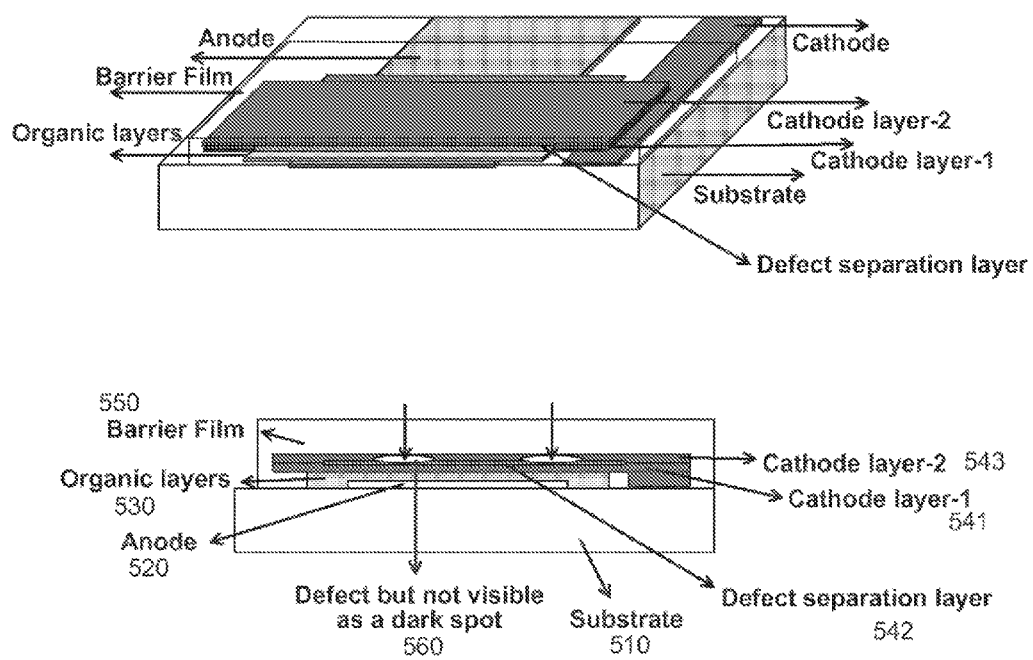
FIG. 5 shows a schematic 3-D and the cross-sectional views of a device with multiple layer cathode. Formation of defects (not forming dark spots) away from the cathode-organic interface is shown.

FIG. 5 shows a schematic 3-D and the cross-sectional views of a device with a multiple layer or "split" cathode. Formation of defects (not forming dark spots) away from the cathode-organic interface is shown. The device of FIG. 5 includes a substrate 510, an anode 520, organic layers 530, a cathode, and a barrier film 550. The cathode includes first conductive layer 541, separation layer 542 and second conductive layer 543. Dark spot 460 is also shown.

In FIG. 5, which shows the 3-D and the cross-sectional views of a device with split-cathode, the delamination defects form at the interface between the second conductive layer and the separation layer. As the defects are away from the active area, the device continues to emit light. The defect separation layer (DSL) has a different water vapor permeation rate than the cathode. In one case, it has much higher water vapor permeation rate than the cathode. The high permeation rate results in quick dispersion of water molecules across the sandwich layer and allows sufficient time for the second conductive layer (cathode layer 2 or CL-2)— DSL interface to react with the moisture. Note that the first conductive layer may also be referred to as cathode layer 1 or CL-1. In another case, the permeation rate across the sandwich layer is much less than the cathode. In that case, the water vapor will be forced to travel across the interface of the CL-2—DSL interface allowing it to react with the cathode.

Embodiment 2

Figure 6:
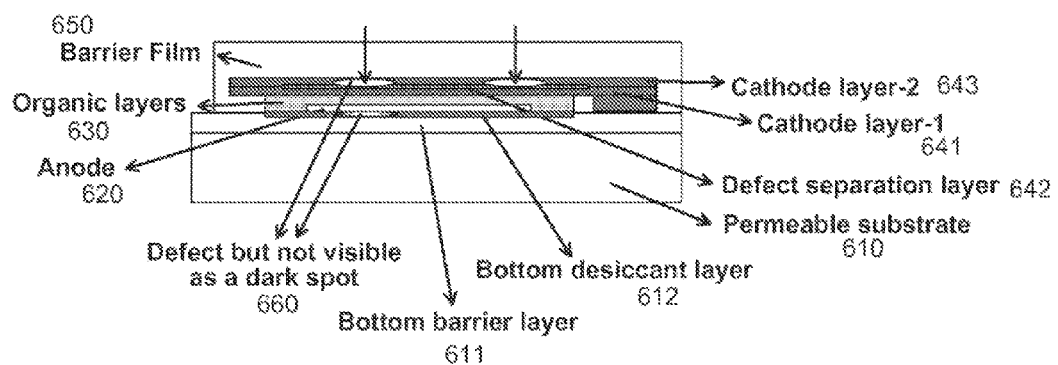
FIG. 6 shows a cross-sectional view of a flexible device with bottom desiccant layer and multiple layer cathode. Formation of defects (not forming dark spots) away from the cathode-organic interface above and below the device is shown.

FIG. 6 shows a cross-sectional view of a flexible device with bottom desiccant layer and multiple layer cathode. Formation of defects (not forming dark spots) away from the cathode-organic interface is shown. The device of FIG. 6 includes a substrate 610, a permeation barrier layer 611 (also called a bottom barrier layer), a water reacting layer 612 (also called a bottom dessicant layer), bottom an anode 620, organic layers 630, a cathode, and a barrier film 650. The cathode includes first conductive layer 641, separation layer 642 and second conductive layer 643. Dark spot 660 is also shown.

The embodiment of FIG. 6 involves a flexible substrate which is permeable to water vapor. Such a substrate preferably involves the use of a bottom barrier film. In such a device water vapor travels from both top and bottom sides. As in previous embodiment, water vapor coming from both top and bottom sides may reach the water sensitive cathode and form defects at the cathode-organic interface which would appear as dark spots in the device. In addition to the split-cathode, this embodiment has thin moisture reacting layer sandwiched between the bottom barrier and the anode. This layer acts as a desiccant layer absorbing the water molecules coming through the plastic substrate and the bottom barrier layer.

Embodiment 3

Figure 7:
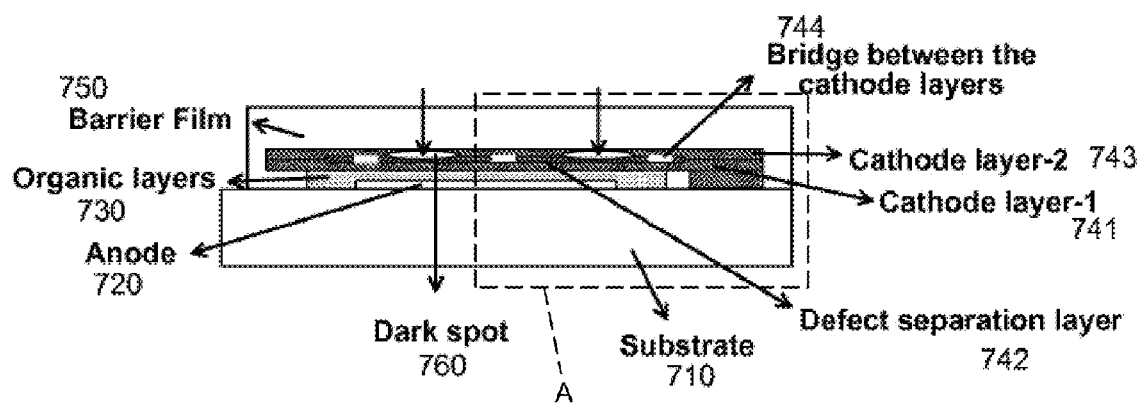
Figure 7A:
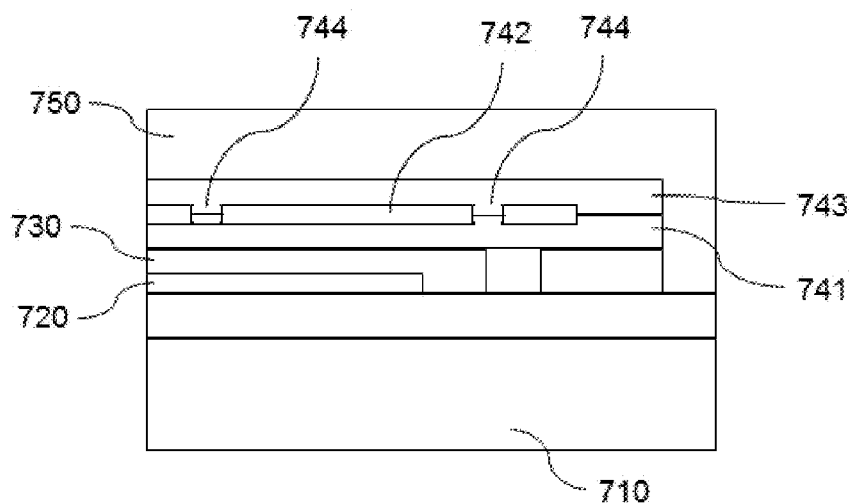

FIG. 7 shows a cross-sectional view of a device with multiple layer cathode with bridges between the two cathode layers via breaks in the sandwich layer. Formation of defects (not forming dark spots) away from the cathode-organic interface is shown. The device of FIG. 7 includes a substrate 710, a first electrode 720, organic layers 730, a second electrode, and a barrier film 750. The cathode includes first conductive layer 741, separation layer 742 and second conductive layer 743. Dark spot 760 is also shown.

Figure 8:
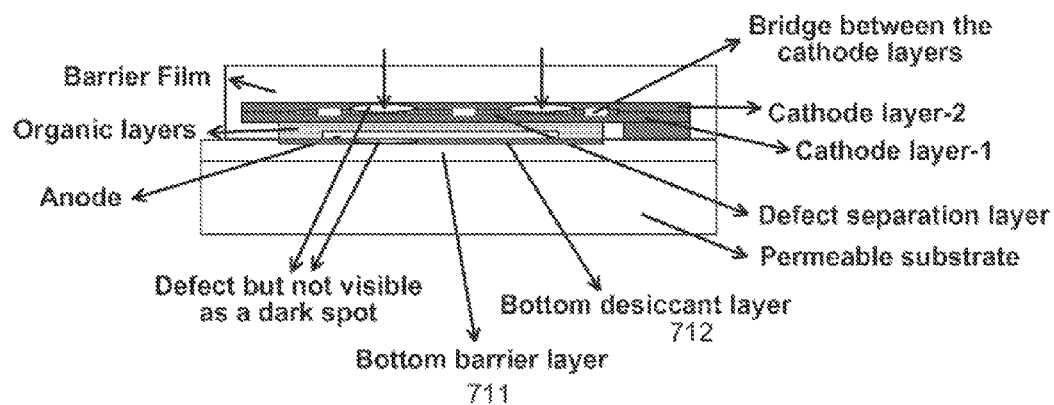
FIG. 8 shows a cross-sectional view of a flexible device with multiple layer cathode with bridges between the two cathode layers via breaks in the sandwich layer.

In the embodiment of FIG. 7, the first and second conductive layers are bridged by bridges 744. That is, separation layer 742 has regions where it allows the first and second conductive layers to touch. Separation layer 742 is not necessarily continuous. This configuration utilizes the conductivity of the second conductive layer. Over a period of storage, because of defect formation, the second conductive layer may become completely electrically isolated from the underlying device. For a thin cathode, this would mean that only the first conductive layer would participate in carrier transport. A very thin cathode would have high resistance which can make the device non-uniform when operated. If the second (and possibly any additional) conductive layers are bridged to the first conductive layer, the combined stack would still have an input in the overall conduction. Because the bridges occupy only a fraction of the area of the second electrode, they do not have as deleterious an effect on the formation of dark spots as a simple single layer electrode. FIGS. 7 and 8 illustrate this embodiment for rigid and flexible substrates, where FIG. 8 adds to FIG. 7 a permeation barrier layer 711 (also called a bottom barrier layer), a water reacting layer 712 (also called a bottom dessicant layer).

Figure 9:
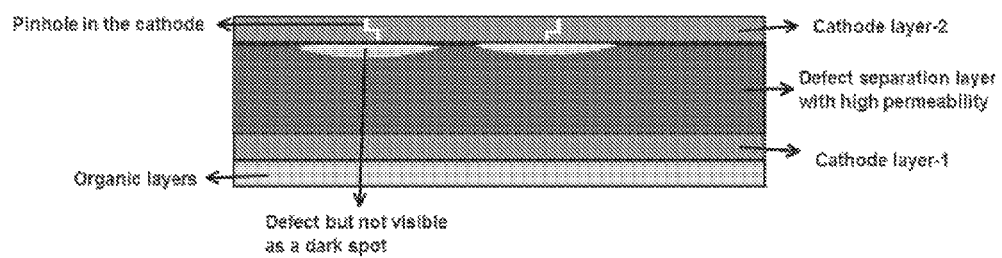
FIG. 9 shows a schematic cross-sectional view of organic layer of the OLED device and CL-1 and -2 with a defect separation layer (DSL) in between. The DSL has higher water vapor transmission rate than the cathode. This allows the water molecules to disperse across the layer quickly at the same time allowing the CL-2 to react with water and form defects which are not visible as dark spots in the device.

FIG. 9 shows a schematic cross-sectional view of organic layer of the OLED device and CL-1 and -2 with a defect separation layer (DSL) in between. The DSL has higher water vapor transmission rate than the cathode. This allows the water molecules to disperse across the layer quickly at the same time allowing the CL-2 to react with water and form defects which are not visible as dark spots in the device.

Figure 10:
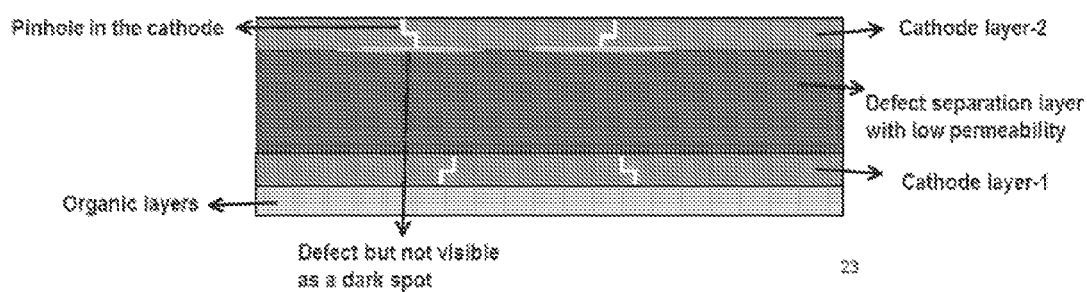
FIG. 10 shows a schematic cross-sectional view of organic layer of the OLED device and CL-1 and -2 with DSL in between. The DSL has lower water vapor transmission rate than the cathode. This forces the water molecules to disperse across the interface of the CL-2 with the DSL and react with the cathode to form defects which are not visible as dark spots in the device.

FIG. 10 shows a schematic cross-sectional view of organic layer of the OLED device and CL-1 and -2 with DSL in between. The DSL has lower water vapor transmission rate than the cathode. This forces the water molecules to disperse across the interface of the CL-2 with the DSL and react with the cathode to form defects which are not visible as dark spots in the device.

FIG. 11 shows a schematic cross-sectional view of organic layer of the OLED device and CL-1 and an extended cathode. The pinholes and other defects in the cathode continue to grow. The end result is not much different than if only the first CL were present. The defects form at the CL-1—organic interface and are visible as dark spots.

Method of Device Fabrication

The device fabrication method can be divided into the following steps:
1. Substrate, planarization*, and bottom permeation barrier*
2. Bottom desiccant*(only for flexible permeable substrate)
3. OLED Deposition
4. Cathode Deposition
5. Thin Film Encapsulation
6. Lamination The use of a planarization layer and a bottom permeation barrier are preferred only for use with flexible substrates, which tend to have significant water permeability. Rigid substrates can generally be made thick enough that water permeation through the substrate is not an issue, although there may be exceptions.

1. Substrate, planarization, and bottom permeation barrier: Rigid substrates could be any glass, or ceramic, or thick metallic substrate. Flexible substrates could be thin metal foils, such as Al or stainless steel, or plastics, such as PET or PEN, or paper or fabric or composites such as ceramic matrix composites, metal matrix composites, or polymer matrix composites. Substrates could comprise a single material, compound materials and/or laminated layers.

Flexible substrates are preferably planarized prior to OLED growth. Flexible metal and plastic substrates often suffer from high asperity count and high rms roughness. Various planarization methods can be used, such as deposition of a resist (e.g. polyimide), followed by a hard bake, or alternatively deposition of an inorganic dielectric using methods such as PECVD. The planarization layer may remove electrical contact between the OLED and the substrate. This is particularly desirable in the case of metal foils, where in some circumstances it may be advantageous not to have electrical current flowing through the substrate. The planarization layer may also act as a permeation barrier, which is particularly desirable in the case of plastic substrates, where oxygen and moisture can permeate through the substrate.

2. Bottom desiccant: For permeable substrates, it is preferred to deposit a thin film layer after the barrier layer that is is a moisture consuming or water reacting layer. It can be any metal, or inorganic, or organic material or combinations thereof which can form a chemical compound with water.

3. OLED Deposition: The anode and/or bus lines could be deposited by any suitable technique, including VTE or sputtering through a shadow mask, or blanket deposited and then patterned using photolithography. Examples of anode materials include IZO, ITO, Al, Ag or combinations thereof. Individual anode areas are preferably patterned around the cuts/scores in the substrate.

Examples of bus line materials include Al, Ag, Au, Cu. Bus lines may pass over score marks made on the reverse of the substrate. In some examples individual pixel areas are connected in parallel using bus lines, whereas in other examples pixels are connected in series. In some examples, a single large area pixel could be used.

4. Cathode Deposition: The layer on top of the OLED stack is the CL (cathode layer). The split-CL for both rigid and flexible substrates is, as described before, a stacked cathode in which the first layer acts as a conduction and electron injection layer, whereas the remaining layers act to move dark spot forming defects away from the cathode-organic interface. The first CL can be any suitable low work function layer such as Ca or MgAg, deposited by evaporation or other thin film deposition processes. The DSL can be any thin metallic, organic, or inorganic layer whose function is to separate the coming second CL from the first CL. The DSL must be different from the cathode in terms of water vapor transmission. It should either have higher permeation rate than the cathode so that water molecules upon reaching the DSL get dispersed quickly at the interface allowing them to form defects at the interface itself. FIG. 6 describes this situation. Or it should have lower permeation rate than the cathode so that water molecules are forced to follow the interface path, react with cathode and form defects. FIG. 7 describes this situation. In both cases, the defects form away from the cathode-organic interface as intended. The DSL cannot be an extended (thicker) cathode. In such a case, the water vapor would travel unintruded to the cathode-organic interface. FIG. 8 describes this situation. The sandwich layer itself can absorb moisture. The second CL can be another low work function metal or inorganic film like the first cathode. It can be different from the first cathode. In some cases more than two cathode layers can be used to enhance the defect separation and moisture consumption effect. In some cases the top most CL can be topped by another organic or inorganic layer to prevent the cathode from getting damaged by the encapsulation process to follow.

5. Thin Film Encapsulation (TFE): When fabricating an OLED on a flexible substrate, especially, but many times on rigid substrates also, thin film encapsulation (TFE) is used to prolong the shelf life of the device. Thin film encapsulation layers can be inorganic or a combination of inorganic and organic materials. The inorganic materials provide an effective barrier against the permeation of moisture and oxygen, while the organic materials provide mechanical flexibility and help to distribute any faults in the inorganic layers, which increase the diffusion path length through the barrier.

In the first embodiment described above we used PECVD to deposit a TFE layer of thickness <10 microns through the shadow mask design.

6. Lamination: For all devices with TFE, the top layer after the encapsulation is the lamination layer. It can consist of a thin polymer membrane attached to the substrate using an adhesive, or a thin spun-on polymer layer, or an evaporated polymer layer, or a spray coated, aerosol dispersed polymer layer. The lamination layer prevents the thin film encapsulation from getting scratched or damaged during handling. It can also perform optical function when desired. In the fluttering lighting device embodiment, the lamination layer is an aerosol dispersed polymer film on top of the thin film encapsulation.

While the method above is described with respect to a device having a cathode as the second electrode, it is understood that embodiments may also involve an anode used as the second electrode, i.e., the electrode further away from the substrate.

Example 1

Figure 12:
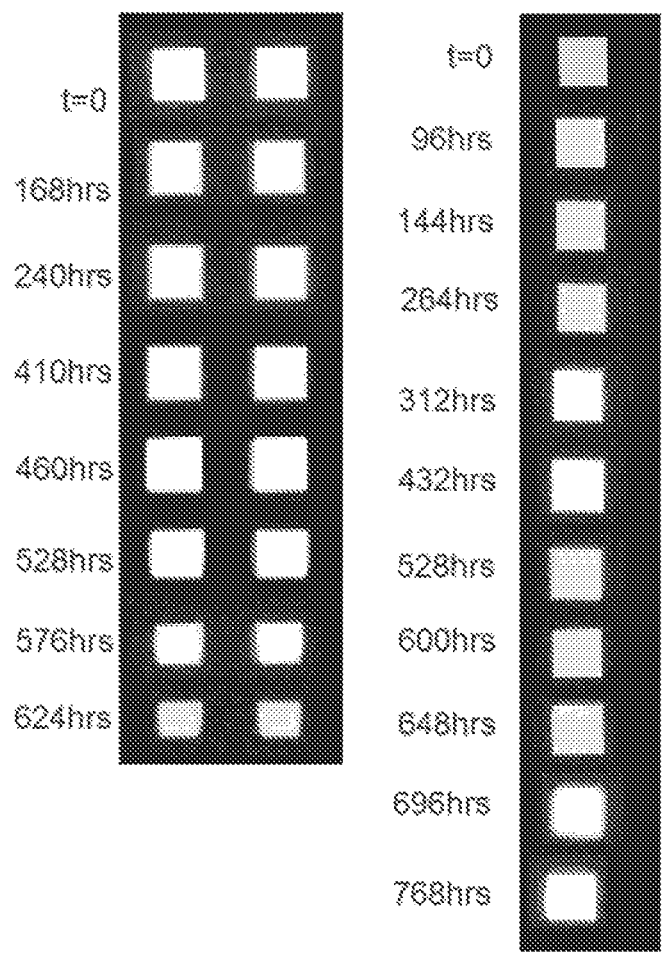
FIG. 12 shows photographs of active areas of bottom-emitting OLED devices during the shelf-life tests at 85° C. and 85% RH encapsulated with similar thin film encapsulation. The left side photo shows active areas of the bottom-emitting OLED devices whose cathodes are single layer 200 nm Al. The right side photo shows active areas of the bottom-emitting OLED devices whose cathodes comprise 100 nm Al, followed by 60 nm NPD, followed by 100 nm Al. The lag time (time for the onset of degradation) is about 480 hrs in the first case shown in the left side photo, whereas it is about 650 hrs in the second case shown in the right side photo.

Some of the inventive concepts were tested by preparing bottom-emitting OLED (BOLED) devices and encapsulating them with thin film encapsulation. The first device had 200 nm thick Al cathode and the second had 100 nm Al, 60 nm NPD, and 100 nm Al cathode. The devices were encapsulated with similar thin film (same thickness) encapsulation barrier films and then were stored at 85° C. and 85% RH for shelf-life tests. FIG. 12 shows the photographs of active areas of the devices during the shelf-life tests. Using the single layer cathode (the left side photograph), the maximum lag time (i.e., the time until noticeable device degradation occurs) obtained was around 500 hrs. Using the bifurcated cathode (the right side photograph), the lag time increased to about 650 hrs. Under the accelerated conditions of 85° C. and 85% RH this is a 30% increase in the lag time.

Figure 13:
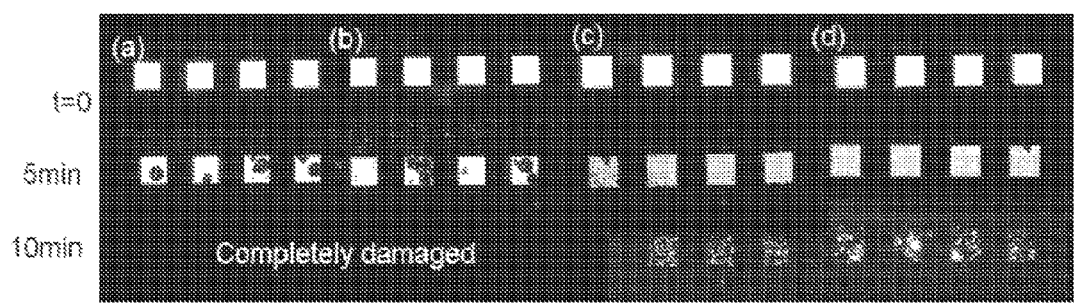
FIG. 13 shows a photographs of active areas of bottom-emitting OLED devices during the shelf-life tests at 85° C. and 85% RH encapsulated without thin film encapsulation. (a) and (b) The cathode is single layer 200 nm Al. (c) and (d) The cathode is 100 nm Al, followed by 60 nm NPD, followed by 100 nm Al. All the devices got disintegrated by water vapor within 10 min at 85° C. and 85% RH.

A comparison was also made of the devices discussed with respect to FIG. 12 to similar devices without thin film encapsulation. FIG. 13 shows photographs of active areas of bottom-emitting OLED devices during the shelf-life tests at 85° C. and 85% RH encapsulated with and without thin film encapsulation, and with and without a split cathode. (a) shows photographs for a single layer 200 nm Al cathode, without encapsulation. (b) shows photographs for a single layer 200 nm Al cathode, with encapsulation. (c) shows photographs for a cathode that is 100 nm Al, followed by 60 nm NPD, followed by 100 nm Al, without encapsulation. (d) shows photographs for devices similar to those of (c), but with encapsulation. The devices without the defect separation layer lasted only 10 min in such harsh atmospheric conditions, but the devices with a defect separation layer lasted noticeably longer.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limited to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compound.

Examples of aromatic amine derivatives used in HIL or HTL include, but not limited to the following general structures:

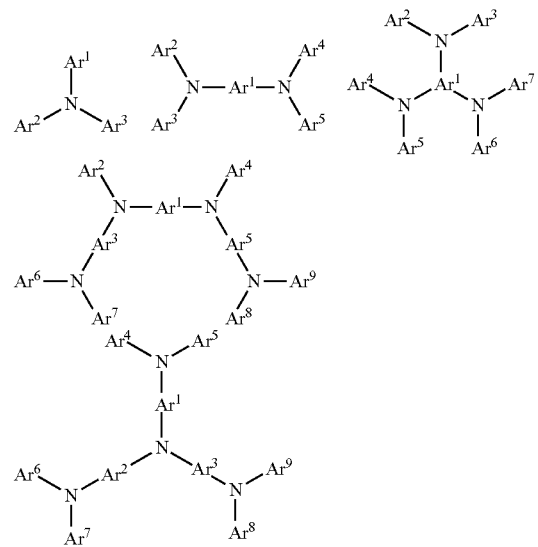

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

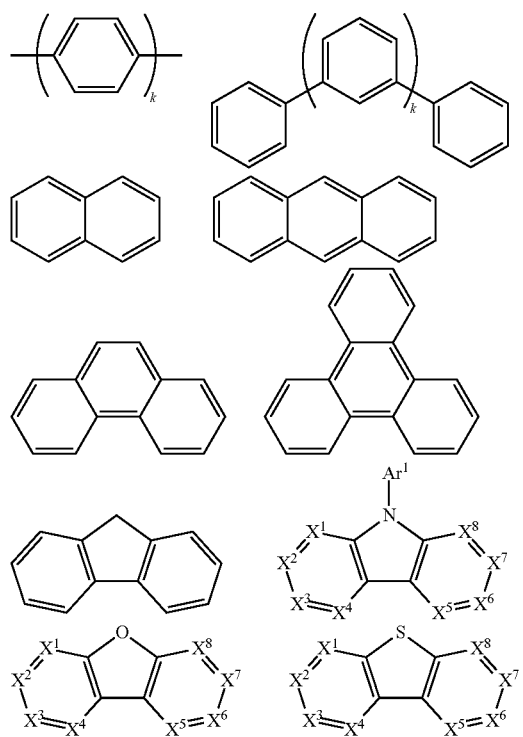

k is an integer from 1 to 20; $X^1$ to $X^8$ is C (including CH) or N; $Ar^1$ has the same group defined above.

Examples of metal complexes used in HIL or HTL include, but not limited to the following general formula:

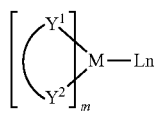

M is a metal, having an atomic weight greater than 40; $(Y^1-Y^2)$ is a bidentate ligand, $Y^1$ and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1-Y^2)$ is a 2-phenylpyridine derivative.
In another aspect, $(Y^1-Y^2)$ is a carbene ligand.
In another aspect, M is selected from Ir, Pt, Os, and Zn.
In a further aspect, the metal complex has a smallest oxidation potential in solution vs. $Fc^+/Fc$ couple less than about 0.6 V.

Host:
The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

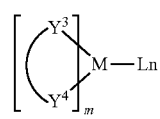

M is a metal; $(Y^3-Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

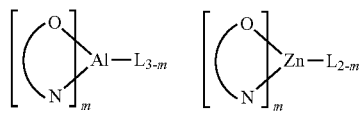

(O—N) is a bidentate ligand, having metal coordinated to atoms O and N.

In another aspect, M is selected from Ir and Pt.
In a further aspect, $(Y^3-Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

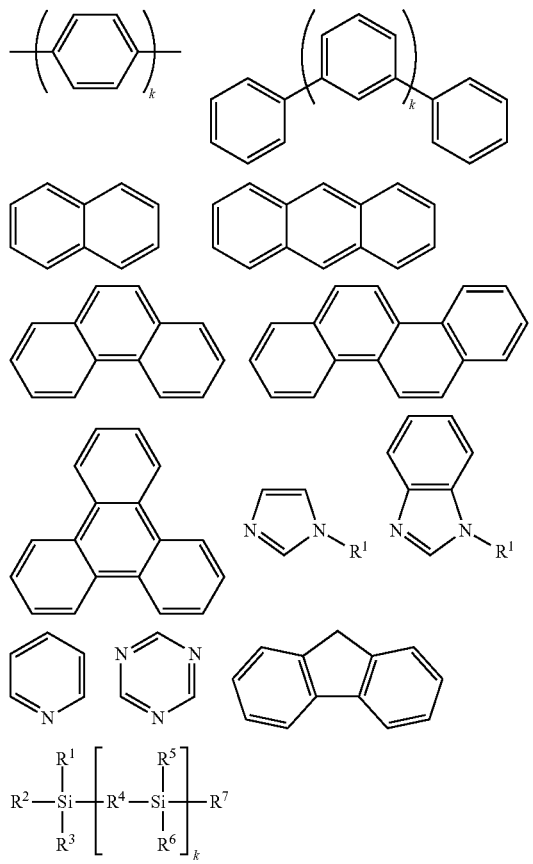
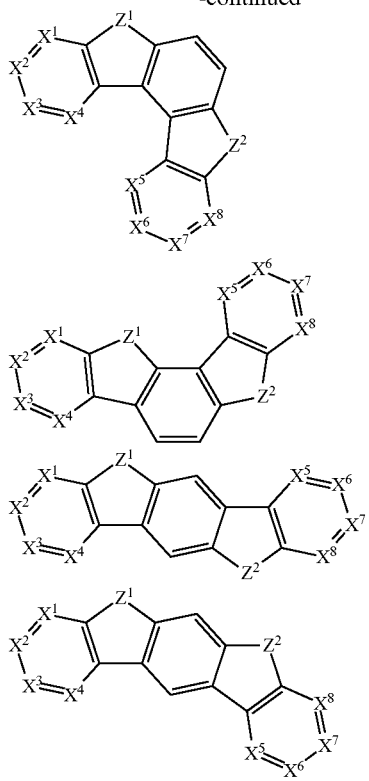
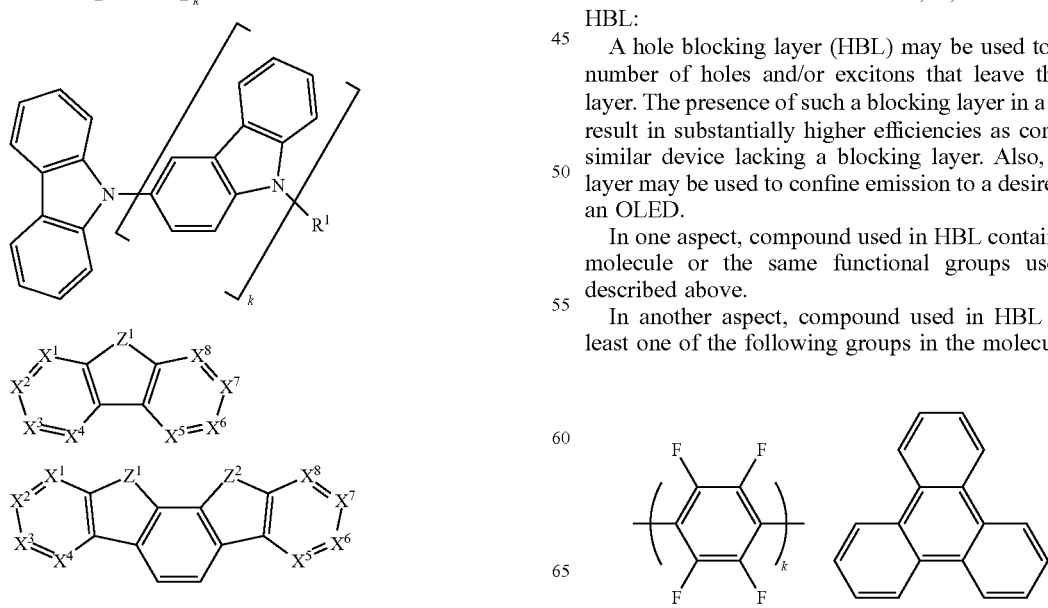

$R^1$ to $R^7$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfmyl, sulfonyl, phosphino, and combinations thereof, when it is aryl or heteroaryl, it has the similar definition as Ar's mentioned above.

k is an integer from 0 to 20.

$X^1$ to $X^8$ is selected from C (including CH) or N.

$Z^1$ and $Z^2$ is selected from $NR^1$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

-continued

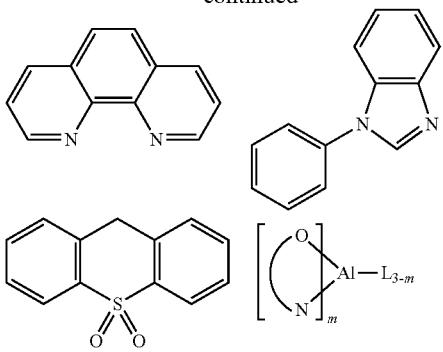

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

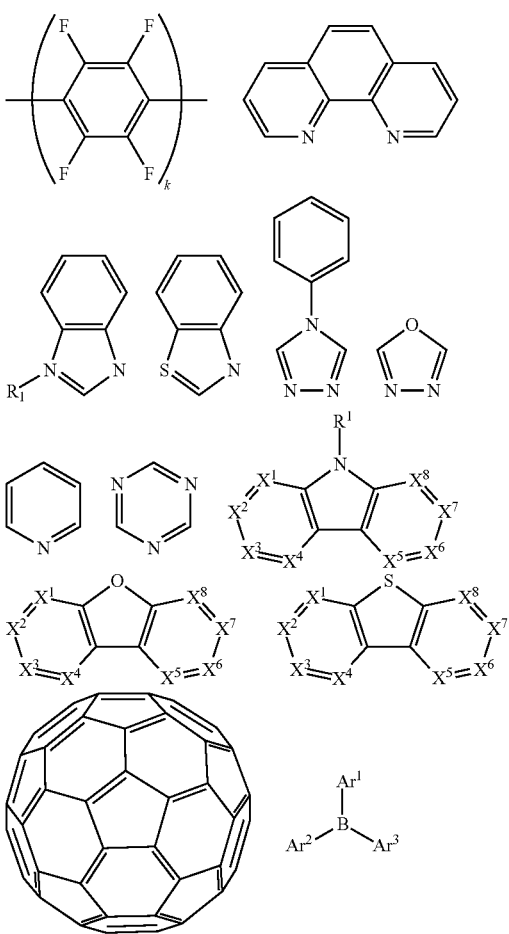

$R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from C (including CH) or N.

In another aspect, the metal complexes used in ETL contains, but not limited to the following general formula:

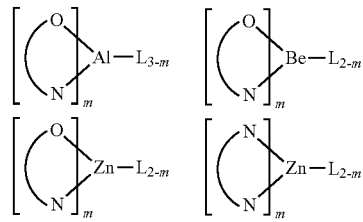

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exciton/hole blocking layer materials, electron transporting and electron injecting materials may be used in an OLED.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A device, comprising:
    a first electrode;
    an organic emissive layer disposed over the first electrode; and
    a second electrode disposed over the organic emissive layer, the second electrode further comprising:
        a first conductive layer having an extinction coefficient and an index of refraction;
        a first separation layer disposed over the first conductive layer, the first separation layer having an extinction coefficient that is at least 10% different from the extinction coefficient of the first conductive layer at 500 nm; or wherein the first separation layer has an index of refraction that is at least 10% different from the index of refraction of the first conductive layer at 500 nm, wherein the first separation layer consists essentially of an organic material;

a second conductive layer disposed over the first separation layer; and a barrier layer disposed over the second conductive layer, wherein the first separation layer is not a continuous layer and the first and second conductive layers are bridged where the first separation layer is not continuous.

2. The device of claim 1, wherein the first separation layer has an extinction coefficient that is at least 10% different from the extinction coefficient of the first conductive layer at 500 nm.

3. The device of claim 2, wherein the first separation layer has an extinction coefficient less than 5 at 500 nm.

4. The device of claim 2 wherein the first separation layer has an extinction coefficient less than 3 at 500 nm.

5. The device of claim 2, wherein the first separation layer has an extinction coefficient less than 1 at 500 nm.

6. The device of claim 1, wherein the first separation layer has a thickness of at least 20 nm.

7. The device of claim 1, wherein the first conductive layer has a thickness not more than 150 nm.

8. The device of claim 1, wherein the first conductive layer has a water vapor transmission rate at least 5% different from that of the first separation layer, and the second conductive layer has a water vapor transmission rate at least 5% different from that of the first separation layer.

9. The device of claim 1, wherein the first conductive layer has a water vapor transmission rate at least 10% different from that of the first separation layer, and the second conductive layer has a water vapor transmission rate at least 10% different from that of the first separation layer.

10. The device of claim 1, wherein the first conductive layer has a water vapor transmission rate at least 25% different from that of the first separation layer, and the second conductive layer has a water vapor transmission rate at least 25% different from that of the first separation layer.

11. The device of claim 1, wherein the first conductive layer is a low work function metallic layer or an inorganic layer.

12. The device of claim 11, wherein the first conductive layer is a low work function metallic layer comprising a material selected from Al, Ca and MgAg.

13. The device of claim 1, wherein the second conductive layer is a low work function metallic layer or an inorganic layer.

14. The device of claim 13, wherein the second conductive layer is a low work function metallic layer comprising a material selected from Al, Ca, and MgAg.

15. The device of claim 1, wherein the first conductive layer and the second conductive layer have the same material composition.

16. The device of claim 1, wherein the first conductive layer and the second conductive layers have different material compositions.

17. The device of claim 1, wherein the first separation layer is a metallic layer, an inorganic layer, or an organic layer.

18. The device of claim 1, wherein the device further comprises a substrate, and the first electrode is disposed over the substrate.

19. The device of claim 18, wherein the substrate is a rigid substrate having a flexural rigidity greater than $2 \times 10^{-2}$ Nm.

20. The device of claim 19, wherein the substrate is a flexible substrate having a flexural rigidity less than $2 \times 10^{-2}$ Nm.

21. The device of claim 20, wherein the first electrode is an anode, and the device further comprises:

a permeation barrier layer disposed between the anode and the substrate; and a water reacting layer disposed between the substrate and the anode.

22. The device of claim 18, further comprising a lamination layer disposed over the barrier layer.

23. The device of claim 1, wherein the second electrode further comprises:

a second separation layer disposed over the second conductive layer, and a third conductive layer disposed over the second separation layer.

24. The device of claim 1, wherein the first separation layer consists essentially of a single material.

25. The device of claim 1, wherein the first separation layer comprises a mixture of at least two different materials.

26. The device of claim 1, wherein the first separation layer comprises a plurality of sublayers, wherein at least two of the sublayers have a different material composition.

27. The device of claim 1, wherein the barrier layer is transparent.

28. A method, comprising:

depositing over a substrate, a first electrode, an organic emissive layer, and a second electrode, wherein depositing the second electrode comprises the following steps in sequence:

depositing a first conductive layer over the organic emissive layer, the first conductive layer having an extinction coefficient and an index of refraction;

depositing a first separation layer over the first conductive layer, wherein the first separation layer is not a continuous layer and the first separation layer having an extinction coefficient that is at least 10% different from the extinction coefficient of the first conductive layer at 500 nm; or wherein the first separation layer has an index of refraction that is at least 10% different from the index of refraction of the first conductive layer at 500 nm, wherein the first separation layer consists essentially of an organic material; and depositing a second conductive layer over the first separation layer, whereby the first and second conductive layers are bridged where the first separation layer is not continuous; and depositing a barrier layer over the second conductive layer of the second electrode.

* * * * *